United States Patent
Hayashi et al.

(10) Patent No.: US 12,066,458 B2
(45) Date of Patent: Aug. 20, 2024

(54) CONDUCTIVE PARTICLE-DISPOSED FILM HAVING CONDUCTIVE PARTICLES DISPOSED WITHIN AN ELASTOMER FILM, METHOD FOR PRODUCING THE SAME, TEST PROBE UNIT, AND CONTINUITY TEST METHOD

(71) Applicant: DEXERIALS CORPORATION, Tokyo (JP)

(72) Inventors: Shinichi Hayashi, Utsunomiya (JP); Yasushi Akutsu, Utsunomiya (JP)

(73) Assignee: DEXERIALS CORPORATION, Tokyo (JP)

( * ) Notice: Subject to any disclaimer, the term of this patent is extended or adjusted under 35 U.S.C. 154(b) by 227 days.

(21) Appl. No.: 16/465,012

(22) PCT Filed: Nov. 20, 2017

(86) PCT No.: PCT/JP2017/041699
§ 371 (c)(1),
(2) Date: May 29, 2019

(87) PCT Pub. No.: WO2018/101107
PCT Pub. Date: Jun. 7, 2018

(65) Prior Publication Data
US 2019/0293683 A1    Sep. 26, 2019

(30) Foreign Application Priority Data
Nov. 30, 2016    (JP) ................................. 2016-233397

(51) Int. Cl.
*G01R 1/067*    (2006.01)
*G01R 1/06*    (2006.01)
(Continued)

(52) U.S. Cl.
CPC ............... *G01R 1/067* (2013.01); *G01R 1/06* (2013.01); *G01R 31/26* (2013.01);
(Continued)

(58) Field of Classification Search
CPC ........ G01R 1/06; G01R 1/067; G01R 1/0735; G01R 31/26; G01R 31/2601;
(Continued)

(56) References Cited

U.S. PATENT DOCUMENTS

2003/0178221 A1    9/2003 Chiu et al.
2010/0327232 A1*   12/2010 Yamamoto ............. H05K 3/323
                                                            252/500

(Continued)

FOREIGN PATENT DOCUMENTS

CN    1434980 A    8/2003
CN    104541411 A    4/2015
(Continued)

OTHER PUBLICATIONS

Apr. 14, 2021 Office Action issued in Taiwanese Patent Application No. 106141629.
(Continued)

*Primary Examiner* — Jay Patidar
(74) *Attorney, Agent, or Firm* — Oliff PLC

(57) ABSTRACT

A conductive particle-disposed film of the present invention useful for a test probe unit for a continuity test of a fine-pitch continuity test object such as a semiconductor device is configured so that conductive particles are disposed in the surface direction of the elastomer film. The thickness of the elastomer film approximately coincides with the average particle diameter of the conductive particles. Ends of the conductive particles are positioned in the vicinity of respective outermost faces of both surfaces of the elastomer film. The same or different conductive particle-disposed films
(Continued)

may be layered. A pressure-sensitive adhesive layer may be formed on at least one surface of the conductive particle-disposed film.

14 Claims, 8 Drawing Sheets

(51) Int. Cl.
*G01R 31/26* (2020.01)
*H01R 11/01* (2006.01)
*H01R 43/00* (2006.01)

(52) U.S. Cl.
CPC ......... *G01R 31/2601* (2013.01); *H01R 11/01* (2013.01); *H01R 43/00* (2013.01)

(58) Field of Classification Search
CPC ............ G01R 31/2812; G01R 31/2863; G01R 31/54; H01R 11/01; H01R 43/00
See application file for complete search history.

(56) References Cited

U.S. PATENT DOCUMENTS

| | | | |
|---|---|---|---|
| 2012/0292082 A1* | 11/2012 | Miyauchi | B32B 7/12 174/250 |
| 2013/0126216 A1* | 5/2013 | Khosla | H01B 1/24 264/105 |
| 2015/0214176 A1 | 7/2015 | Shinohara | |

FOREIGN PATENT DOCUMENTS

| | | |
|---|---|---|
| JP | S61-188818 A | 8/1986 |
| JP | 63-102110 A | 5/1988 |
| JP | H8-148213 A | 6/1996 |
| JP | H10-188672 A | 7/1998 |
| JP | H10-200242 A | 7/1998 |
| JP | 2001-52793 A | 2/2001 |
| JP | 2001-240816 A | 9/2001 |
| JP | 2001-351702 A | 12/2001 |
| JP | 2004-288911 A | 10/2004 |
| JP | 3951333 B2 | 5/2007 |
| JP | 2007-232627 A | 9/2007 |
| JP | 2009-98065 A | 5/2009 |
| JP | 2011-38831 A | 2/2011 |
| JP | 2013-037944 A | 2/2013 |
| JP | 2013-161553 A | 8/2013 |
| JP | 2014-60150 A | 4/2014 |
| JP | 2015-201435 A | 11/2015 |
| JP | 2016-131152 A | 7/2016 |
| JP | 2016-131245 A | 7/2016 |
| JP | 6187665 B1 | 8/2017 |
| KR | 10-2007-0027697 A | 3/2007 |

OTHER PUBLICATIONS

Jan. 23, 2018 International Search Report issued in International Patent Application PCT/JP2017/041699.
Jan. 23, 2018 Written Opinion issued in International Patent Application PCT/JP2017/041699.
Nov. 6, 2018 Written Opinion of the IPEA issued in International Patent Application PCT/JP2017/041699.
Jan. 29, 2019 International Preliminary Report on Patentability issued in International Patent Application PCT/JP2017/041699.
Jan. 4, 2021 Office Action issued in Chinese Patent Application No. 201780070701.4.
Dec. 28, 2021 Notice of Reasons for Refusal issued in Japanese Patent Application No. 2017-222924.
Apr. 7, 2020 Notification of Reason for Refusal issed in Korean Patent Application No. 10-2019-7013651.
Apr. 17, 2020 Office Action issued in Chinese Patent Application No. 201780070701.4.
Sep. 27, 2022 Decision of Refusal issued in Japanese Patent Application No. 2017-222924.
Nov. 10, 2023 Office Action issued in Chinese Patent Application No. 202111522759.2.
Mar. 5, 2024 Notice of Reasons for Refusal issued in Japanese Patent Application No. 2022-205255.
Apr. 23, 2024 Office Action issued in Chinese Patent Application No. 202111522759.2.

* cited by examiner

CONDUCTIVE PARTICLE-DISPOSED FILM HAVING CONDUCTIVE PARTICLES DISPOSED WITHIN AN ELASTOMER FILM, METHOD FOR PRODUCING THE SAME, TEST PROBE UNIT, AND CONTINUITY TEST METHOD

TECHNICAL FIELD

The present invention relates to a conductive particle-disposed film useful as a test probe member, an anisotropic conductive connector, or an anisotropic conductive adapter in a test probe unit used in a continuity test of a semiconductor device, or the like.

BACKGROUND ART

When a continuity test of a semiconductor device is performed, a test probe unit in which a probe member including a plurality of minute rod-shaped electrodes arranged in a surface direction is connected to a test circuit substrate is generally employed. However, since a region to be tested does not always have a smooth surface but has some roughness, there is a concern that the conventional simple test probe unit cannot follow the roughness of the region to be tested, thus failing to obtain a high-precision continuity test result. Moreover, since the probe member is directly pressed against, and in contact with, a terminal of the semiconductor device, there is also a concern that an appearance defect may occur in the test region. In light of this, it is conceivable that an anisotropic conductive elastomer sheet (Patent Literature 1) in which groups of conductive particles continuously provided in a thickness direction by means of a parallel magnetic field are disposed apart from one another in a surface direction is disposed, as an anisotropic conductive connector, between a probe member and a test circuit substrate in a test probe unit in order to prevent, at the time of the continuity test, deterioration in test precision due to the roughness of the region to be tested and to prevent the occurrence of an appearance defect in the semiconductor device (Patent Literature 2).

CITATION LIST

Patent Literature

Patent Literature 1: Japanese Patent Application Laid-Open No. Hei. 10-188672
Patent Literature 2: Japanese Patent Application Laid-Open No. 2009-98065

SUMMARY OF INVENTION

Technical Problem

According to the anisotropic conductive elastomer sheet of Patent Literature 1, however, the group of conductive particles continuously provided in the thickness direction may be curved by the influence of the magnetic field. In order to ensure stable insulation between the groups of conductive particles disposed apart from one another in the surface direction, implementation of fine pitch in the surface direction of the anisotropic conductive elastomer sheet has to be sacrificed. Moreover, when the test is performed with such a sheet, there are a wide variety of specifications. Thus, a sheet having better ease of handling has been desired.

A problem of the present invention is to enable a high-precision continuity test result to be obtained when a continuity test of a fine-pitch continuity test object such as a semiconductor device is performed with a test probe unit even if a region to be tested does not have a smooth surface but has some roughness as well as to prevent the occurrence of an appearance defect. Further, it is to provide a continuity test member having excellent ease of handling such that the continuity test member can be easily used even if the region to be tested has a smooth surface or the continuity test object has no fine pitch.

Solution to Problem

The present inventors have found that the aforementioned problems can be solved by using, instead of the anisotropic conductive elastomer sheet of Patent Literature 1, a conductive particle-disposed film in which conductive particles are embedded around the center, in a depth direction, of an elastomer film having approximately the same thickness as an average particle diameter of the conductive particles, and disposed in a surface direction of the elastomer film as a test probe member, as an anisotropic conductive connector, or as an anisotropic conductive adapter. Finally, the present inventors have completed the present invention.

More specifically, the present invention provides a conductive particle-disposed film that is a particle-disposed film including conductive particles disposed in a surface direction of an elastomer film. In the conductive particle-disposed film,
  a thickness of the elastomer film approximately coincides with an average particle diameter of the conductive particles, and
  ends of the conductive particles are positioned in the vicinity of respective outermost faces of both surfaces of the elastomer film.

Moreover, the present invention provides a method for producing the aforementioned conductive particle-disposed film, including:
  disposing conductive particles in a plurality of concave portions in a transfer mold in which the concave portions are formed in a planar direction; pressing an elastomer film against a surface of the transfer mold in which the concave portions are formed so as to transfer the conductive particles to the elastomer film; interposing the elastomer film having the transferred conductive particles between a pair of platens; and subjecting the elastomer film to application of heat and pressure so as to push the conductive particles into the elastomer film.

Furthermore, the present invention provides a test probe unit in which the aforementioned conductive particle-disposed film is mounted, as a test probe member, to an electronic circuit substrate for continuity test.

In addition, the present invention provides a test probe unit having: an electronic circuit substrate for continuity test; and a probe member including an electrode structure in electrical continuity with the electronic circuit substrate for continuity test. In this test probe unit,
  the aforementioned conductive particle-disposed film is disposed, as an anisotropic conductive connector, between the electronic circuit substrate for continuity test and the probe member.

Furthermore, the present invention provides a test probe unit having: an electronic circuit substrate for continuity test; and a probe member including an electrode structure in electrical continuity with the electronic circuit substrate for continuity test. In this test probe unit, the aforementioned conductive particle-disposed film is disposed, as an anisotropic conductive adapter, at a tip of the probe member opposite to the electronic circuit substrate for continuity test.

Moreover, the present invention provides a test probe unit having: an electronic circuit substrate for continuity test; and a probe member having an electrode structure in electrical continuity with the electronic circuit substrate for continuity test. In this test probe unit, the aforementioned conductive particle-disposed film is disposed, as an anisotropic conductive adapter, at a tip of the probe member opposite to the electronic circuit substrate for continuity test and at the tip of the probe member near the electronic circuit substrate for continuity test.

Note that the present invention also provides a continuity test method in which the aforementioned test probe unit is applied to a continuity test object.

Advantageous Effects of Invention

In the conductive particle-disposed film of the present invention, the conductive particles are embedded around the center, in the depth direction, of the elastomer film having approximately the same thickness as the average particle diameter of the conductive particles, and disposed in the surface direction of the elastomer film. Thus, coupling the conductive particles in the thickness direction of the film is not required, thereby allowing for a continuity test of a fine-pitch continuity test object such as a semiconductor device (for example, a rectangular terminal having a width of 2 to 15 μm, a terminal having a distance of 3 to 25 μm between terminals, or the like). When a continuity test is performed with a low resistance value smaller than 1000 mΩ, for example, in order to improve the precision of the continuity test, a plurality of conductive particles can be brought into contact with a terminal. Thus, even when a distance between terminals becomes larger than the aforementioned range in a continuity test object, the continuity test can be performed with low resistance and with high precision. Furthermore, since the conductive particles are pressed against, and in contact with, the continuity test object at its approximately planar surface, an appearance defect of the continuity test object can be prevented from occurring. Note that it also becomes possible to perform a continuity test of a continuity test object having a smooth region to be tested or a non-fine-pitch continuity test object with high precision. In other words, the reliability of continuity can be determined on the continuity test object in a simplified and non-destructive manner.

A test probe unit including the conductive particle-disposed film of the present invention can exhibit the advantageous effects of the invention derived from the conductive particle-disposed film of the present invention. Furthermore, if the conductive particle-disposed film can be used for fine pitch, such a film can be applied also to a wide-pitch continuity test object without changing the design of the conductive particle-disposed film.

DESCRIPTION OF EMBODIMENTS

Figure 1:
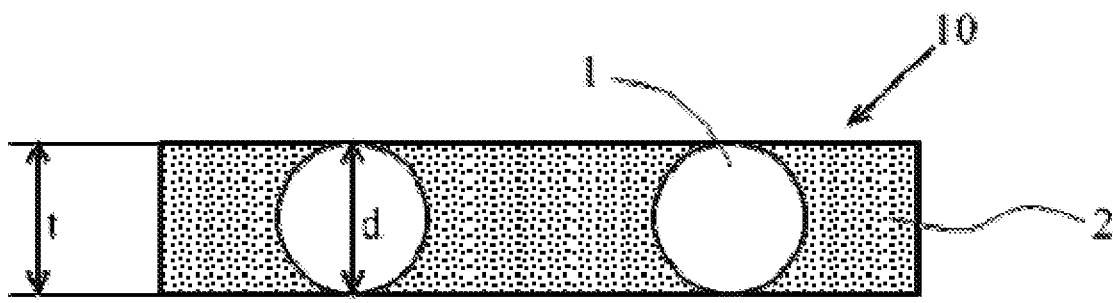
FIG. 1 is a cross-sectional view of a conductive particle-disposed film according to the present invention.

An example of a conductive particle-disposed film according to the present invention will be described below in detail with reference to the drawings. Note that the same reference numerals in the drawings denote the same or equivalent components.

<Overall Configuration of Conductive Particle-Disposed Film>

Figure 2:
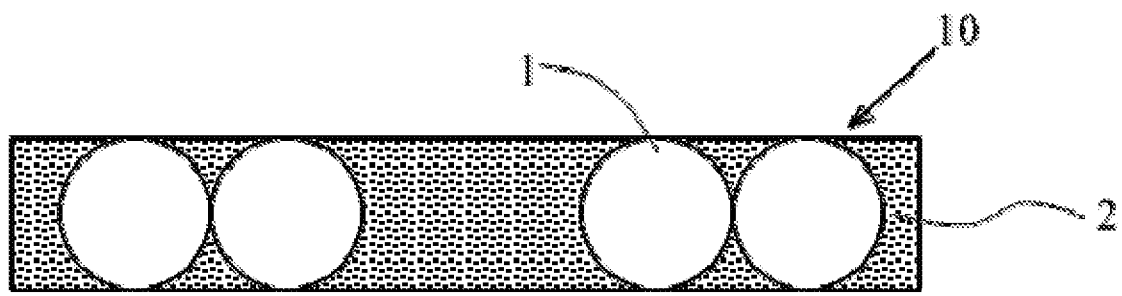
FIG. 2 is a cross-sectional view of a conductive particle-disposed film according to the present invention.

FIG. 1 is a cross-sectional view of a conductive particle-disposed film 10 according to the present invention. In this conductive particle-disposed film 10, conductive particles 1 are disposed in a surface direction of an elastomer film 2. The phrase "being disposed in a surface direction" as used herein refers to a state in which the conductive particles 1 are disposed apart from each other (preferably, a state in which the conductive particles 1 are arranged regularly (for example, in a square lattice form, in a rectangular lattice form, in a rhombic lattice form, or in a hexagonal lattice form)) when the conductive particle-disposed film 10 is seen in a planar view. In this case, a plurality of conductive particles 1 may be planarly grouped or coupled together as one unit, and such units may be separated from one another as shown in FIG. 2. By way of example, a minimum separation distance (the shortest distance between conductive particles) is preferably greater than or equal to 0.5 times, more preferably greater than or equal to 0.7 times, the conductive particle diameter in order to avoid undesired contact of the conductive particles. The separation distance has no particular upper limit, and such an upper limit can be set as appropriate on the basis of a target object. As an example for fine pitch, however, the upper limit of the separation distance is preferably smaller than or equal to 10 times, more preferably smaller than or equal to five times, and furthermore preferably smaller than or equal to two times, the conductive particle diameter. Note that the conductive particles 1 being disposed apart from each other means that, in a rectangular or square area having 1000 or more, preferably 2000 or more, conductive particles, for example, preferably 95% or more, more preferably 98% or more, and further preferably 99.5% or more of the all conductive particles are independent of one another. When conductive particles are intentionally coupled together, the coupled conductive particles are counted as one conductive particle (the conductive particle diameter refers to the size of an individual conductive particle).

A distance between the conductive particles may not necessarily coincide with a distance between terminals as continuity test objects. It is preferable that a distance between the conductive particles be smaller than a distance between terminals as continuity test objects. This is because a plurality of conductive particles being in contact with a terminal as a continuity test object can reduce a continuity resistance value. Therefore, the number of the conductive particles to be in contact with a terminal may be one, but is preferably three or more, more preferably 11 or more.

In the conductive particle-disposed film 10 of the present invention, a thickness t of the elastomer film 2 approximately coincides with an average particle diameter d of the conductive particles 1 as shown in FIG. 1. The reason why the thickness t is made "approximately coincide with" the average particle diameter d is to allow for continuity on both surfaces of the conductive particle-disposed film and to allow the conductive particle to be pressed against, and in contact with, a continuity test object at its approximately planar surface. A relationship of $0.70d \leq t \leq 1.10d$ is generally satisfied.

Figure 3A:
FIG. 3A is a diagram illustrating a positional relationship between an outermost surface of the elastomer film and the conductive particle.
Figure 3B:
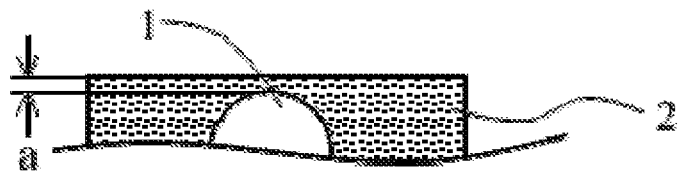
FIG. 3B is a diagram illustrating a positional relationship between the outermost surface of the elastomer film and the conductive particle.
Figure 3C:
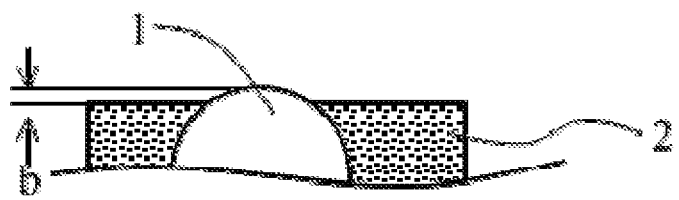
FIG. 3C is a diagram illustrating a positional relationship between the outermost surface of the elastomer film and the conductive particle.

With regard to a positional relationship between the elastomer film 2 and the conductive particle 1, ends of the conductive particle 1 in the present invention need to be positioned in the vicinity of the respective outermost faces of both surfaces of the elastomer film 2. Such "vicinity" state is shown in FIGS. 3A to 3C, which are partial views each illustrating one surface of the elastomer film 2. More specifically, FIG. 3A shows a state in which an end of the conductive particle 1 is in contact with the surface of the elastomer film 2. FIG. 3B shows a state in which an end of the conductive particle 1 is embedded in the film with a distance from the surface of the elastomer film 2. An embedded depth (an elastomer coating thickness) a generally falls within 10%, preferably within 5%, of the thickness of the elastomer film 2 from one of the surfaces of the elastomer film 2. FIG. 3C shows a state in which an end of the conductive particle 1 is exposed from the surface of the elastomer film 2. An exposed height b preferably falls within 30% of the thickness of the elastomer film 2 from one of the surfaces of the elastomer film 2. Therefore, six types of "vicinity" patterns on the both surfaces of the elastomer film 2 can be conceived: a mode in which the both surfaces have the state of FIG. 3A, 3B, or 3C; a mode in which one surface has the state of FIG. 3A and the other surface has the state of FIG. 3B; a mode in which one surface has the state of FIG. 3A and the other surface has the state of FIG. 3C; and a mode in which one surface has the state of FIG. 3B and the other surface has the state of FIG. 3C. Moreover, an exposed degree of the conductive particle from the elastomer film or a degree of covering by elastomer on one surface of the conductive particle-disposed film may be the same as, or different from, that on the other surface of the conductive particle-disposed film.

(Elastomer Film 2)

The thickness t of the elastomer film 2 is determined mainly on the basis of the surface roughness of a continuity test object or the handleability of the conductive particle-disposed film. As will be described later, however, the thickness t of the elastomer film 2 can be adjusted as appropriate according to a mode of layering the conductive particle-disposed films. The thickness t of the elastomer film 2, when applied to a semiconductor device, is preferably 3 μm or more, more preferably 10 μm or more, and particularly preferably 30 μm or more in consideration of a bump height and its variations. The upper limit of the thickness is not limited to any particular value. In consideration of the handleability, fine-pitch compatibility, etc. of the conductive particle-disposed film, however, the upper limit of the thickness is generally 200 μm or less, preferably 100 μm or less, and more preferably 50 μm or less. Note that the thickness t of the elastomer film 2 can be measured with a known film thickness meter (for example, a film tester thickness measuring instrument, HKT Handy series available from Fujiwork Co., Ltd.).

Figure 8:
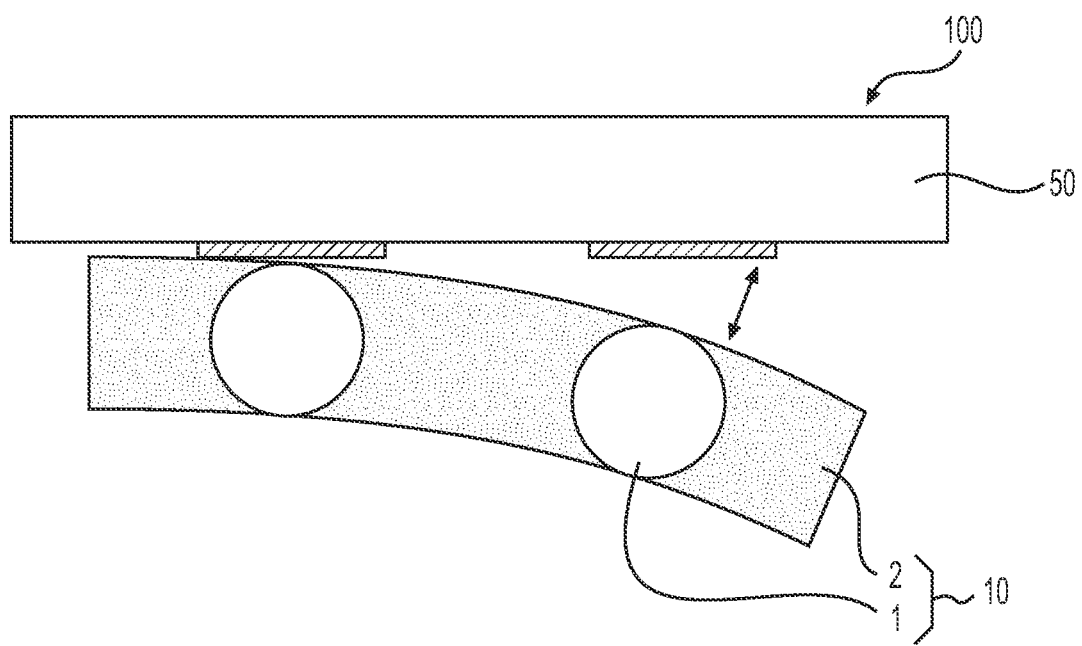
FIG. 8 is another schematic cross-sectional view of a test probe unit in which the conductive particle-disposed film according to the present invention is used as a test probe.

Examples of the above-described elastomer film 2 may include elastomer films of a conjugated diene-based rubber such as polybutadiene, natural rubber, polyisoprene, SBR, and NBR, and a hydrogenated product thereof; a block copolymer such as a styrene butadiene diene block copolymer and a styrene isoprene block copolymer, and a hydrogenated product thereof; and chloroprene, urethane rubber, polyester rubber, epichlorohydrin rubber, silicone rubber, an ethylene propylene copolymer, an ethylene propylene diene copolymer, and silicone rubber. In the case where the elastomer film 2 is required to have weather resistance, an elastomer film other than the conjugated diene-based rubber is preferable, and from the viewpoints of molding processability and electrical characteristics, a silicon rubber film is preferable. In addition, the elastomer film 2 may contain an anisotropic conductive connecting material such as a thermosetting anisotropic conductive film, a thermosetting connecting material for electronic components not containing conductive particles, a pressure-sensitive adhesive composition and an adhesive composition for electronic parts, and a resin used for a resin composition for underfill. Furthermore, a plurality of same or different films may be layered to form a layered-type elastomer film 2. From the viewpoint of convenience, this elastomer film 2 desirably has characteristics that enables the elastomer film 2 to be attached to, and detached from, continuity test objects at the time of testing. In this respect, it can be one of the major differences from the known curable type adhesive films for electronic parts (for example, thermosetting anisotropic conductive films). FIG. 8 shows the elastomer film 2 partially detached from the substrate 50, with a double arrow (pointed at both ends) pointing between the substrate and film indicating the characteristic of the elastomer film being attachable to and detachable from the substrate.

When a thermoset elastomer film is employed as the elastomer film 2, there is obtained, in a layered type, an effect of increasing the number of choices in manufacturing conditions. Furthermore, test conditions can be finely adjusted by layering various films before a test step, or the test step itself can be blackboxed. When the elastomer film 2 contains no thermoset elastomer and has a composition approximately the same as that of a weak pressure-sensitive adhesive film, such an elastomer film 2 is replaceable for each continuity test object, for example. This increases the number of choices in the handleability during the test step. In the case of the layered type, an adjustment to required characteristics can be made by such a combination.

(Conductive Particles 1)

The average particle diameter of the conductive particles 1, on the other hand, has a size that approximately coincides with the elastomer film. The average particle diameter generally only needs to be 200 µm or less. The average particle diameter is preferably 2 µm or more and 50 µm or less, more preferably 2.5 µm or more and 30 µm or less, and particularly preferably 2.8 µm or more and 20 µm or less. Moreover, in order to improve the precision of the continuity test, the conductive particles desirably have a uniform diameter. Specifically, a CV value (standard deviation of conductive particle diameters/average particle diameter of conductive particles) is preferably 20% or less, more preferably 10% or less, and further more preferably 5% or less. Note that the lower limit of the CV value is not limited to any particular value since a smaller lower limit of the CV value makes the particle diameters more uniform, and is thus preferable.

Examples of the conductive particles 1 may include metal particles showing magnetism such as nickel, iron, and cobalt, particles of alloys of these, and nonmagnetic solder particles. These particles may contain noble metals such as gold, silver, palladium, and rhodium, and preferably gold or silver. Further, these metal particles or alloy particles may be used as a core, and the surface of the core may be coated with a noble metal by an electrolytic plating method, an electroless plating method, a sputtering method, a vacuum deposition method or the like. Alternatively, particles including inorganic particles such as non-magnetic metal particles or glass beads or organic polymer particles serving as a core and coated with a conductive magnetic material such as nickel or cobalt and further coated with a noble metal may also be adopted as the conductive particles 1. The metal coated resin particles coated with a metal or the like with the organic polymer particles as the core are preferably adopted from the viewpoint of easily adjusting the conductive state due to deformation of the conductive particles and repulsion of the organic polymer particles at the time of pressurization. Furthermore, conductive fine particle-containing metal-coated resin particles, in which organic polymer particles contain conductive fine particles and are further coated with a metal or the like, may also be adopted. In this case, an effect of lowering the conduction resistance value more can be expected. In the present invention, two or more kinds of the conductive particles 1 as described above may be used in combination.

(Layering of Conductive Particle-Disposed Films)

Figure 4A:
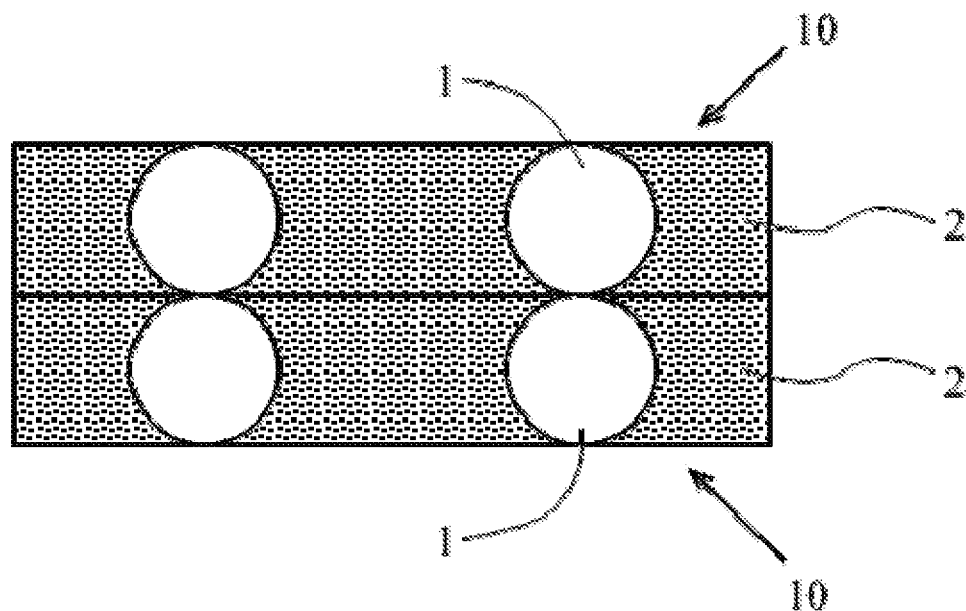
FIG. 4A is a cross-sectional view of a layered-type conductive particle-disposed film according to the present invention.
Figure 4B:
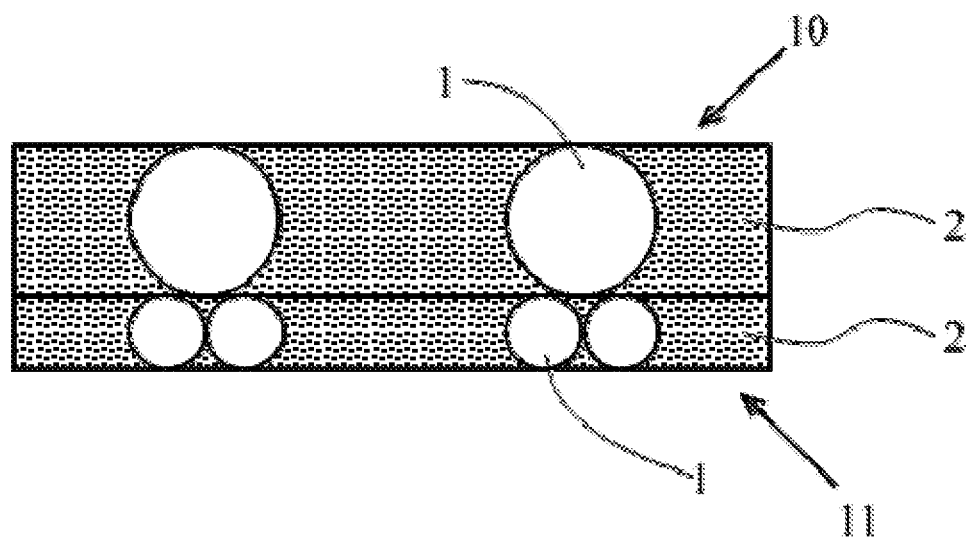
FIG. 4B is a cross-sectional view of a layered-type conductive particle-disposed film according to the present invention.

According to the conductive particle-disposed film 10 of the present invention, a plurality of the same conductive particle-disposed films 10 can be layered in order to increase its total thickness (FIG. 4A). Alternatively, conductive particle-disposed films 10 and 11 different from each other may be layered at the time of layering (FIG. 4B). In the latter case, conductive particles having relatively different particle diameters are used in the conductive particle-disposed film 10 and the conductive particle-disposed film 11. This facilitates the retaining of a coupled state of the conductive particles in a thickness direction of the conductive particle-disposed films, and is thus preferable.

Figure 5A:
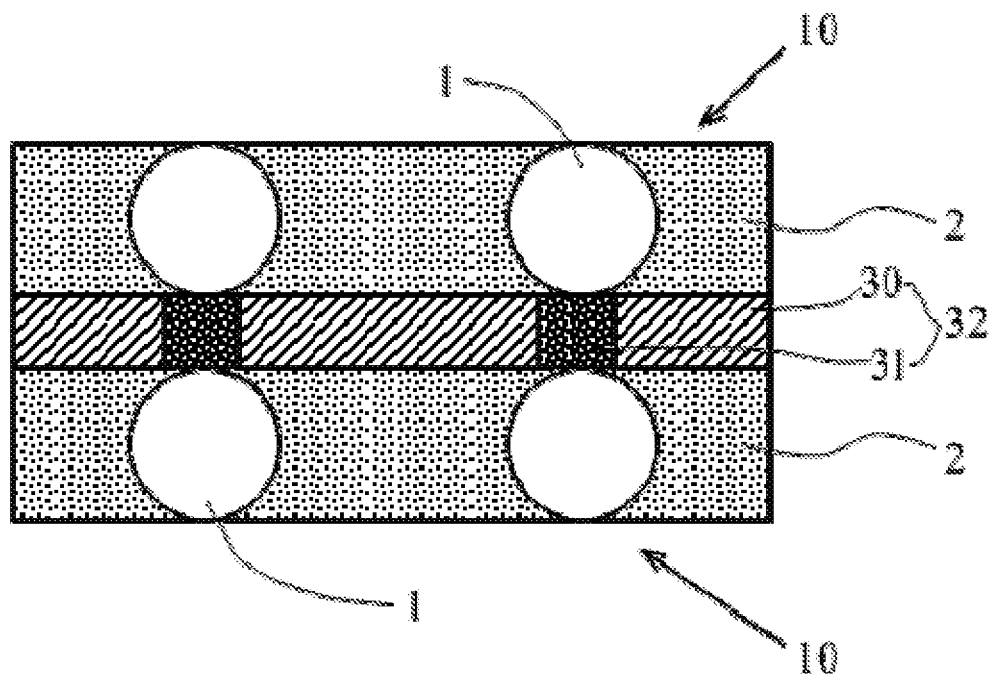
FIG. 5A is a cross-sectional view of a layered-type conductive particle-disposed film according to the present invention using a flexible connector sheet.
Figure 5B:
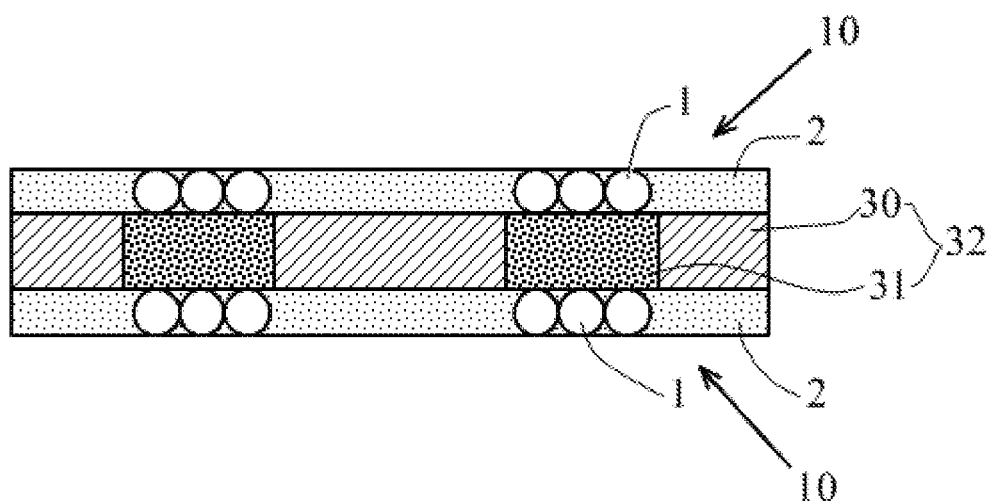
FIG. 5B is a cross-sectional view of a layered-type conductive particle-disposed film according to the present invention using a flexible connector sheet.
Figure 5C:
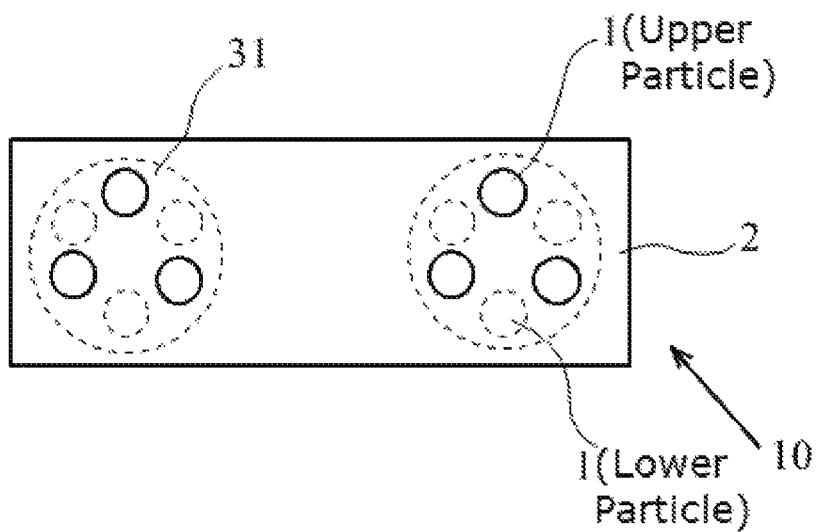
FIG. 5C is a top plan view of the conductive particle-disposed film in FIG. 5B.
Figure 5D:
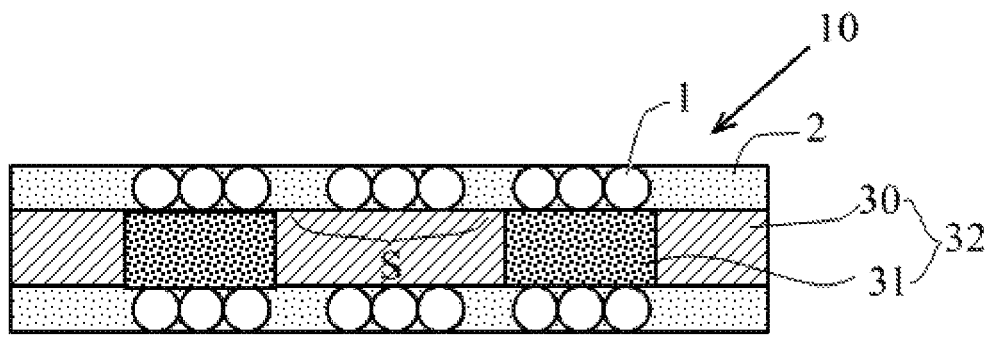
FIG. 5D is a cross-sectional view of a layered-type conductive particle-disposed film according to the present invention using a flexible connector sheet.

When the conductive particle-disposed films 10 are layered, the conductive particle-disposed films 10 and a flexible connector sheet, which is obtained by providing through electrodes in an insulating flexible sheet, may be layered as one unit. As shown in FIG. 5A, a flexible connector sheet 32, which is obtained by providing through electrodes 31 in an insulating flexible sheet 30, may be held between the two conductive particle-disposed films 10 (see Japanese Patent No. 3951333). In this case, while one or two conductive particles may be provided so as to correspond to the through electrode 31 in the conductive particle-disposed film 10, it is preferable that a plurality of conductive particles 1 greater than two (preferably three or more, and more preferably 10 or more) are disposed as shown in FIG. 5B. The plurality of conductive particles 1 disposed corresponding to one through electrode 31 may be coupled together. As shown in FIG. 5C, however, a plurality of conductive particles 1 (upper particles) corresponding to one through electrode 31 may be independently disposed so as to be apart from one another without being coupled together in a planar view. In this case, it is preferable that the conductive particles 1 (lower particles) of the conductive particle-disposed film disposed under the flexible connector sheet be provided so as not to overlap with the conductive particles 1 (upper particles) of the conductive particle-disposed film disposed above the flexible connector sheet. The disposition state of the conductive particles as shown in FIG. 5C can be created, for example, by changing a distance between the conductive particles or the number of the conductive particles, or by differentiating disposition patterns themselves, or by employing the same disposition pattern but with different angles to a reference line. A side of the conductive particle-disposed film or a side of a terminal, for example, may be employed as the reference line. This can prevent the uneven distribution of pressing force at the time of the continuity test. Furthermore, the conductive particles 1 may be present in a region S of the conductive particle-disposed film 10 not facing the through electrode 31 as shown in FIG. 5D.

The flexible connector sheet may be, for example, an FPC using known polyimide, or may be a sheet obtained by providing a through hole in a material as used as a shock-absorbing material, such as a silicone rubber sheet, and providing an electrode therein. The thickness of such a flexible connector sheet can be set as appropriate according to the purpose of the test as with the conductive particle-disposed film 10. The number of layers is not limited to any particular number, and may be set as appropriate according to the purpose of layering. The total thickness including the flexible connector sheet is the same as the total thickness of layered-type conductive particle-disposed films 10 to be described later.

Note that the film thickness t and the average particle diameter d of the conductive particles in a conductive particle-disposed film disposed inside the layered-type conductive particle-disposed films may not satisfy the relationship of $0.70d \leq t \leq 1.10d$. This is because when an insulating flexible sheet is provided with a through electrode as mentioned above and this through electrode projects from a surface of the insulating flexible sheet, the conductive particles present in the conductive particle-disposed film inside the multilayer are pressed by the projected through electrode. It is also conceivable that the elastomer film 2 (a film obtained by eliminating the conductive particles from the conductive particle-disposed film) is layered on at least one surface of the conductive particle-disposed film. This is because when the through electrode projects from the surface of the insulating flexible sheet, a resin is needed to fill a space around the projected through electrode. The multilayer may be a film obtained by layering a conductive particle-disposed film in which conductive particles each having a relatively small particle diameter are densely spread all over and a conductive particle-disposed film including conductive particles each having a relatively large particle diameter (10 to 50 µm by way of example, and preferably 10 to 30 µm). In the conductive particle-disposed film in which the conductive particles each having a relatively small particle diameter (2 to 9 µm by way of example) are densely spread all over, the 2 to 9 µm conductive particles may be disposed in a hexagonal lattice form or may have a disposition analogous to the hexagonal lattice (a lattice obtained by slightly distorting or stretching the hexagonal lattice, a square lattice, a lattice having a conductive particle at the center of the square lattice, or the like). The conductive particles each having a relatively large particle diameter may be provided so as to obtain desired conduction paths via the conductive particles each having a small particle diameter. Since providing only the conductive particles having a relatively large particle diameter has a possibility of causing insufficient contact between the particles, the conductive particles having a relatively small particle diameter can be regarded as playing a supplementary role. It is preferable that the large particle diameter be greater than or equal to two times, preferably greater than or equal to 2.5 times, and more preferably greater than or equal to three times, the small particle diameter. In terms of facilitating the design of the conduction path, the arrangement of the conductive particles having a relatively small particle diameter is preferably the same as the arrangement of the conductive particles having a relatively large particle diameter so as to achieve mutual similarity. Differentiating such arrangements is preferable in terms of avoiding the formation of an irregular conduction path in a film surface direction.

When a plurality of conductive particles are disposed corresponding to the through electrode 31, its conductive particle diameter becomes relatively smaller than when one conductive particle is disposed corresponding to the through electrode 31. Thus, a thickness of one of the layered conductive particle-disposed films 10 becomes thinner accordingly. Therefore, the total thickness can be easily increased to 30 µm or more, for example, by layering two sets or more, preferably four sets or more, of a unit including the conductive particle-disposed film 10 and the flexible connector sheet 32. Thus, it becomes easier to adapt to tests of various continuity test objects including semiconductor devices. In a typical semiconductor package, a solder electrode has a height of about 100 µm. In consideration of this, it is desired to have a thickness of about 400 µm (in this case, the layered type is preferable in terms of a relationship between the thickness and the size of the conductive particle). In recent years, when a terminal of a semiconductor device contains Au, demand for height reduction has been increasing in consideration of reduction in material cost. For example, the height of such a terminal is 8 µm or less, preferably 6 µm or less, and more preferably 3 µm or less. In such a case, or when the test is performed before the provision of terminals (an example in which a continuity test object has an approximately smooth surface), the thickness of the conductive particle-disposed film 10 may be smaller than or equal to 30 µm.

In consideration of being actually applied to a continuity test, the total thickness of the layered-type conductive particle-disposed films 10 (or corresponding to the total thickness including the insulating flexible sheet, if present, as mentioned above) is set on the basis of a bump height of a continuity test object such as a semiconductor device, a semiconductor package, or a wiring substrate provided with electrodes. The lower limit of the total thickness of the layered conductive particle-disposed films 10 is preferably 20 µm or more, more preferably 30 µm or more, and further preferably 50 µm or more. The upper limit of the total thickness of the layered conductive particle-disposed films 10 is preferably 400 µm or less, more preferably 200 µm or less, and further preferably 150 µm or less. When electrodes patterned on a substrate to be tested for continuity are protected with a passivation film with a thickness of about several µm, the total thickness smaller than the aforementioned range of the total thickness may be applied.

In the case of the layered-type conductive particle-disposed films, conductive particles present in the outermost elastomer film may be disposed all over in a hexagonal lattice pattern or in a distorted hexagonal lattice pattern. This is because the number density of the conductive particles can be increased. In order to facilitate the recognition of a pattern shape, the conductive particles may be disposed all over in a square lattice, rectangular lattice, or distorted square or rectangular lattice pattern. Alternatively, a regular disposition may be provided so as to correspond to a terminal arrangement. Since a terminal usually forms a rectangular shape or a circular shape, for example, a disposition having similarity to the outer shape of such a terminal allows for determining the reliability of continuity in the test.

By preparing two or more types of conductive particle-disposed films having different conduction paths, irrespective of whether the film is a layered type or not, for a terminal of a continuity test object and by applying each of such conductive particle-disposed films to a continuity test of the same continuity test object such as a semiconductor device, a continuity failure of the terminal to be a continuity test object can be determined precisely. The different conduction paths as used herein mean that conduction members such as the conductive particles or the through electrodes differ from each other in a cross-sectional view of the films in paths each ranging from the conductive particles in contact with the terminal to be a continuity test object to a receiving section for detecting continuity (such as a continuity section in a test probe unit to be described later). Such two or more types of conductive particle-disposed films having different conduction paths can be obtained by designing a disposition of conductive particles for each conductive particle-disposed film according to the terminal shape or the state of the terminal arrangement in the continuity test object such as a semiconductor device. Alternatively, by bringing one type of conductive particle-disposed film into contact with the continuity test object such as a semiconductor device with varied angles in a planar direction (by reattaching the conductive particle-disposed film with a changed angle, for example), continuity tests can be carried out with the conductive particle-disposed film virtually having two different conduction paths. This is because the cross-checking of the thus obtained test results enables the use for fine pitch and a testable range can be broadened with a single conductive particle-disposed film or the minimum number of conductive particle-disposed films.

Figure 7:
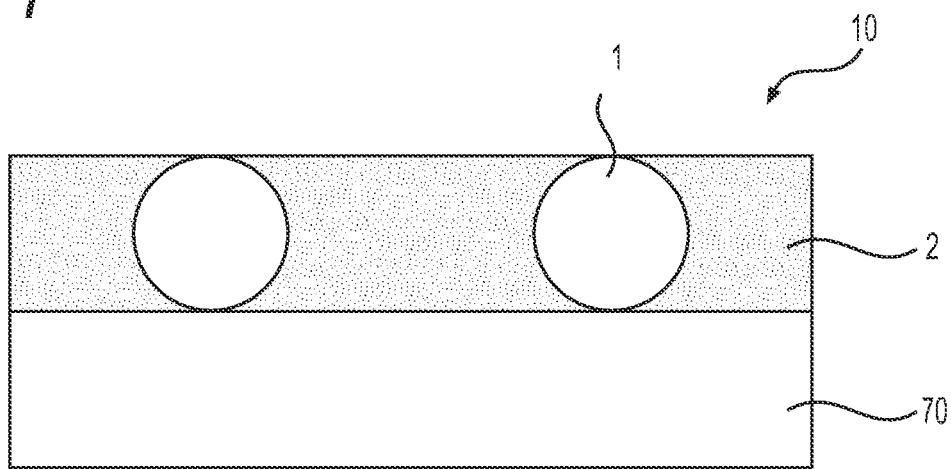
FIG. 7 is another cross-sectional view of a conductive particle-disposed film according to the present invention.

Note that a pressure-sensitive adhesive layer may be further formed on at least one surface of the conductive particle-disposed film 10 of the present invention. FIG. 7 illustrates a pressure-sensitive adhesive layer 70 on the conductive particle-disposed film 10. Providing the pressure-sensitive adhesive layer enables attachment or detachment of the conductive particle-disposed film 10 to or from the conduction test object, or the like. Moreover, since such a pressure-sensitive adhesive layer is a component different from the elastomer film, the pressure-sensitive adhesive layer covers the ends of the conductive particles and thus functions as a protective member for the conductive particles. Thus, providing such a pressure-sensitive adhesive layer allows a continuity test with the conductive particle-disposed film 10 to be performed in a stable manner over a plurality of times. When such a pressure-sensitive adhesive layer is provided, the pressure-sensitive adhesive layer may be provided on only one, or both, of the surfaces of the conductive particle-disposed film 10. If the conductive particles are metal-coated resin particles to be described later, for example, such metal-coated resin particles may not be able to withstand use over a plurality of times depending on the test conditions. Thus, the detachable conductive particle-disposed film is desirable, and it may be preferable to provide a weak pressure-sensitive adhesive layer. Since the weak pressure-sensitive adhesive layer may be provided for the purpose of protecting the conductive particles, its thickness can be made larger than the exposed height of the conductive particles from the elastomer film. Specifically, such a thickness can be set to 25 μm or less by adding a margin to 10% of a conductive particle diameter of 200 μm. In order to obtain a sufficient level of adhesiveness, a thickness of 1 μm or more is preferable, and a thickness of 2 μm or more is more preferable.

An area of the conductive particle-disposed film 10 can be determined according to the intended use of the test, and can be selected from the following combinations. By way of example, the lower limit of one side is preferably 0.5 mm or more, more preferably 0.8 mm or more, and further preferably 2 mm or more. These values are presented on the basis of a film width in a connection body of a typical anisotropic conductive film (i.e., a length of a shorter side of a driver IC, or an actually-pressed tool width of an electrode of an FPC). The larger the upper limit of one side is, the more preferable it is. In consideration of practical ease of handling, however, the upper limit of one side is preferably 600 mm or less, more preferably 450 mm or less, and further preferably 300 mm or less by way of example. As a product form of the conductive particle-disposed film 10, a wound form is preferable in consideration of ease of transportation in particular. In consideration of operability in particular, a sheet form is preferable.

<Method for Producing Conductive Particle-Disposed Film>

The above-described conductive particle-disposed film of the present invention can be produced in a manner similar to a method for producing a conventional anisotropic conductive film in which conductive particles are regularly arranged. For example, the conductive particle-disposed film can be produced by disposing conductive particles in a plurality of concave portions in a transfer mold in which the concave portions have been formed in a planar direction; pressing an elastomer film against a surface of the transfer mold on which the concave portions are formed so as to transfer the conductive particles to the elastomer film; interposing the elastomer film having the transferred conductive particles between a pair of platens; and subjecting the elastomer film to the application of heat and pressure so as to push the conductive particles into the elastomer film (see Japanese Patent No. 6187665, for example).

<Test Probe Unit>

The conductive particle-disposed film of the present invention can be preferably applied as a test probe member, as an anisotropic conductive connector, or as an anisotropic conductive adapter in a test probe unit.

Figure 6A:
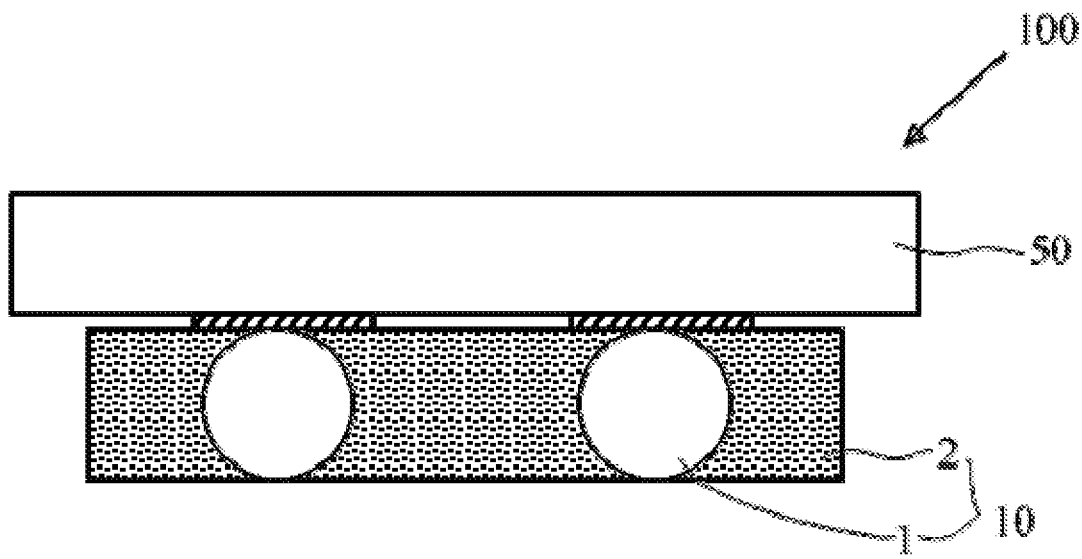
FIG. 6A is a schematic cross-sectional view of a test probe unit in which the conductive particle-disposed film according to the present invention is used as a test probe.

As an example of a test probe unit of the present invention, there is mentioned a test probe unit 100 in which the conductive particle-disposed film 10 (see FIG. 1) of the present invention is mounted, as a test probe member, to an electronic circuit substrate 50 for continuity test as shown in FIG. 6A. In this case, the conductive particle-disposed films shown in FIG. 2, FIG. 4A, FIG. 4B, and FIGS. 5A to 5D can be used instead of the conductive particle-disposed film 10. Note that a conventionally-known electronic circuit substrate for continuity test can be employed as the electronic circuit substrate 50 for continuity test.

Figure 6B:
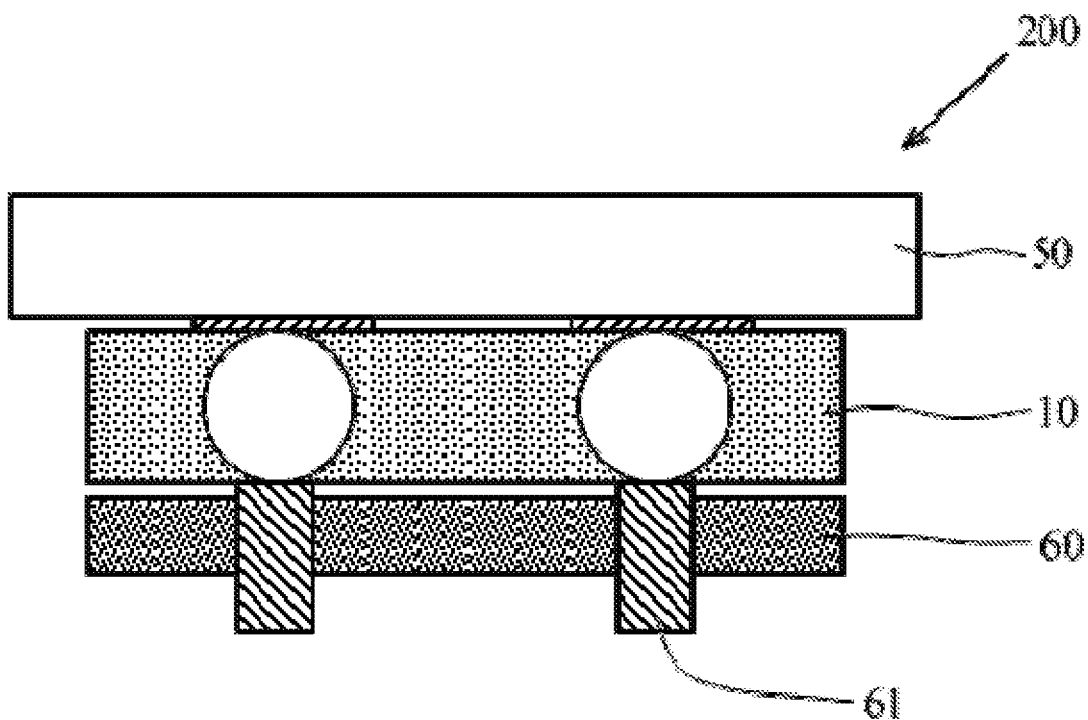
FIG. 6B is a schematic cross-sectional view of a test probe unit in which the conductive particle-disposed film according to the present invention is used as an anisotropic conductive connector.

As another example of the test probe unit of the present invention, there is mentioned a test probe unit 200 having: the electronic circuit substrate 50 for continuity test; and a probe member 60 including electrode structures 61 in electrical continuity with the electronic circuit substrate 50 for continuity test as shown in FIG. 6B. In the test probe unit 200, the conductive particle-disposed film 10 of the present invention is disposed as an anisotropic conductive connector between the electronic circuit substrate 50 for continuity test and the probe member 60. In this case, a conventionally-known electrode structure and probe member can be employed as the electrode structure 61 and the probe member 60.

Figure 6C:
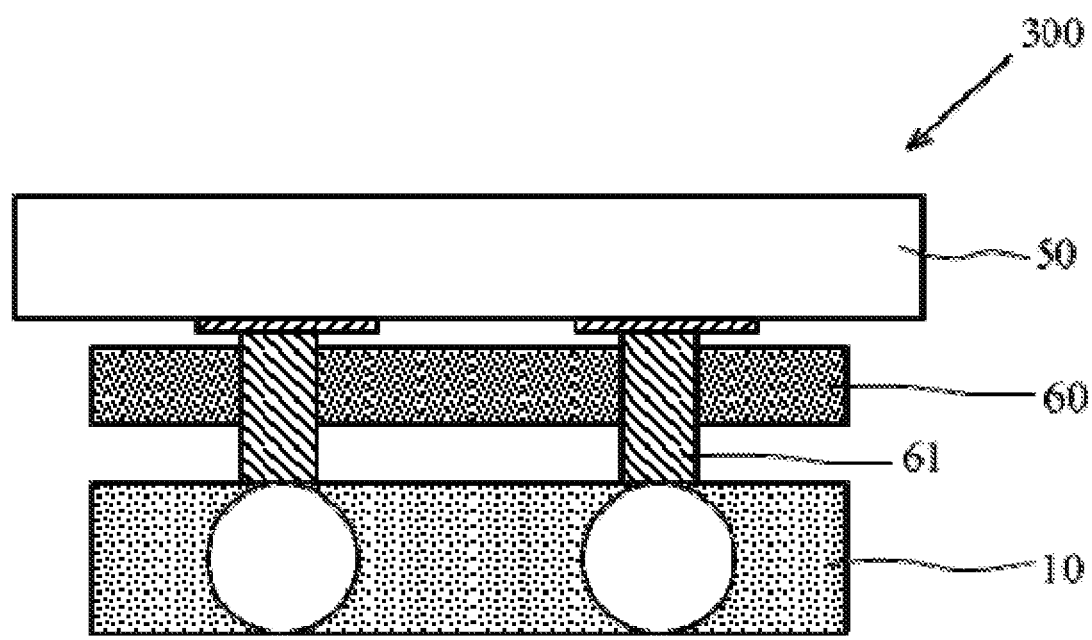
FIG. 6C is a schematic cross-sectional view of a test probe unit in which the conductive particle-disposed film according to the present invention is used as an anisotropic conductive adapter.

As a still another example of the test probe unit of the present invention, there is mentioned a test probe unit 300 having: the electronic circuit substrate 50 for continuity test; and the probe member 60 including the electrode structures 61 in electrical continuity with the electronic circuit substrate 50 for continuity test as shown in FIG. 6C. In the test probe unit 300, the conductive particle-disposed film 10 of the present invention is disposed as an anisotropic conductive adapter at a tip of the probe member 60 opposite to the electronic circuit substrate 50 for continuity test. In this case, the conductive particle-disposed film 10 of the present invention may be additionally disposed between the electronic circuit substrate 50 for continuity test and the probe member 60.

In the test probe unit as described above, its specification may need to be changed every time a bump layout changes. If the conductive particle-disposed film to be used as a probe member can be used for fine pitch, such a test probe unit can be applied also to a wide-pitch continuity test object without changing the design of the conductive particle-disposed film. Thus, such a test probe unit is excellent also in terms of economic efficiency.

<Continuity Test Method>

The test probe unit of the present invention can be preferably applied to continuity tests for a wide variety of electronic components such as semiconductor devices. Specifically, a continuity test can be performed by causing the probe member of the test probe unit to be pressed against, and in contact with, an electrode of an electronic component, which is a continuity test object, and measuring, by a known method, an electrical resistance value between the electrode of the electronic component and the electronic circuit substrate for continuity test, which constitutes the test probe unit, via the conductive particle-disposed film.

In such a continuity test, in order to perform the test with high precision, a lower resistance value of each individual terminal to be measured is more preferable. By way of example, a terminal resistance value of less than 1000 mΩ has practically no problem. The terminal resistance value is preferably 200 mΩ or less, more preferably 100 mΩ or less, and further preferably 50 mΩ or less. This can be selected as appropriate according to the object to be tested or the test conditions. It is desirable that a continuity resistance value in this case imply a state in which sufficient pressing force is applied to the continuity test object and a stable resistance value is provided.

Examples of temperature conditions in the continuity test may include room temperature conditions (20° C.±15° C.), low temperature conditions (−40° C., for example), or high temperature conditions (100° C., for example). Further examples may include heat cycle temperature conditions (−40° C./100° C./1000 cycles).

A terminal pitch (the minimum terminal length+a space between terminals) of a continuity test object such as a semiconductor device is typically about 200 μm. The test probe unit of the present invention, however, can be used for a narrower terminal pitch. This is because conductive particles having a particle diameter of from about 2.5 μm to 30 μm, for example, can be disposed on an outermost surface of the test probe unit. Specifically, if a single conductive particle is needed to function as a probe, disposing conductive particles having a particle diameter of 3 μm in a hexagonal lattice form with a distance between centers of adjacent particles of 6 μm can yield a test terminal of about 10×10 μm. Thus, as a terminal pitch of the continuity test object while such a pitch depends on a size of an electrode to be in contact with the conductive particle, a terminal pitch of about 20 μm is possible if the minimum length of the electrode is about 10 μm and the minimum distance between the electrodes is about 10 μm.

It can be considered that a continuity resistance value to be measured in the continuity test depends on the material and size of the conductive particle, and also the number of the conductive particles to be in contact with the electrode. Thus, a wider terminal pitch may be required depending on a continuity resistance value to be measured. Therefore, the lower limit of a terminal pitch capable of being applied to the continuity test is preferably 20 μm or more, more preferably 30 μm or more, and further preferably 50 μm or more. The upper limit of such a terminal pitch is preferably 400 μm or less, more preferably 200 μm or less, and further preferably 150 μm or less.

INDUSTRIAL APPLICABILITY

In the conductive particle-disposed film of the present invention, the conductive particles are embedded around the center, in a depth direction, of the elastomer film having approximately the same thickness as the average particle diameter of the conductive particles, and disposed in the surface direction of the elastomer film. Thus, the conductive particle-disposed film of the present invention is useful for a high-precision continuity test of a fine-pitch continuity test object such as a semiconductor device. Note that the conductive particle-disposed film of the present invention is useful also for a high-precision continuity test of a continuity test object having a smooth region to be tested or a non-fine-pitch continuity test object.

REFERENCE SIGNS LIST 1 conductive particle
2 elastomer film
10, 11 conductive particle-disposed film
30 insulating flexible sheet
31 through electrode
32 flexible connector sheet
50 electronic circuit substrate for continuity test
60 probe member
61 electrode structure
100, 200, 300 test probe unit
t thickness of elastomer film
d average particle diameter of conductive particles

The invention claimed is:

1. A conductive particle-disposed film comprising a plurality of thermoset elastomer films layered together, wherein each thermoset elastomer film in the conductive particle-disposed film comprises conductive particles disposed in a surface direction of a thermoset elastomer in a manner such that 95% or more of all of the conductive particles in a rectangular or square area of the thermoset elastomer film having 2000 or more of the conductive particles are regularly and independently disposed in a planar view of the thermoset elastomer film, wherein,
  a thickness t of the thermoset elastomer film approximately coincides with an average particle diameter d of the conductive particles in such a manner that
  opposite ends of the conductive particles are exposed at respective outermost faces of both surfaces of the thermoset elastomer film,
  one end of the conductive particles is exposed at the outermost face of the surface such that an exposed height falls within 30% of the thickness t of the thermoset elastomer film, and
  the conductive particle-disposed film is attachable to and detachable from an electronic circuit substrate.

2. The conductive particle-disposed film according to claim 1, further comprising a pressure-sensitive adhesive layer formed on at least one surface of the conductive particle-disposed film.

3. A test probe unit comprising the conductive particle-disposed film according to claim 1 that is mounted, as a test probe member, to the electronic circuit substrate for continuity test.

4. A test probe unit comprising: an electronic circuit substrate for continuity test; and a probe member including an electrode structure in electrical continuity with the electronic circuit substrate for continuity test, wherein
  the conductive particle-disposed film according to claim 1 is disposed, as an anisotropic conductive connector, between the electronic circuit substrate for continuity test and the probe member.

5. A test probe unit comprising: an electronic circuit substrate for continuity test; and a probe member including an electrode structure in electrical continuity with the electronic circuit substrate for continuity test, wherein
  the conductive particle-disposed film according to claim 1 is disposed, as an anisotropic conductive adapter, at a tip of the probe member opposite to the electronic circuit substrate for continuity test.

6. A test probe unit comprising: an electronic circuit substrate for continuity test; and a probe member having an electrode structure in electrical continuity with the electronic circuit substrate for continuity test, wherein
  the conductive particle-disposed film according to claim 1 is disposed, as an anisotropic conductive adapter, at a tip of the probe member opposite to the electronic circuit substrate for continuity test.

7. A test probe unit comprising: an electronic circuit substrate for continuity test; and a probe member having an electrode structure in electrical continuity with the electronic circuit substrate for continuity test, wherein the conductive particle-disposed film according to claim 1 is disposed, as an anisotropic conductive adapter, at a tip of the probe member opposite to the electronic circuit substrate for continuity test and at the tip of the probe member near the electronic circuit substrate for continuity test.

8. The conductive particle-disposed film according to claim 1, wherein the conductive particles have a uniform diameter.

9. The conductive particle-disposed film according to claim 1, wherein a CV value of the average conductive particle diameter is 20% or less and an average particle diameter of the conductive particles is 200 µm or less.

10. The conductive particle-disposed film according to claim 1, wherein the conductive particles are at least one selected from the group consisting of metal particles, alloy particles, solder particles, metal-coated resin particles, and conductive fine particle-containing metal-coated resin particles.

11. The conductive particle-disposed film according to claim 1, wherein the conductive particle-disposed film comprises two of the thermoset elastomer films layered together with a flexible connector sheet therebetween, the flexible connector sheet comprising electrodes in an insulating flexible sheet.

12. The conductive particle-disposed film according to claim 11, wherein in a plane perpendicular to the surface direction, the conductive particles in one of the two thermoset elastomer films are not aligned with any of the conductive particles in the other of the two thermoset elastomer films.

13. The conductive particle-disposed film according to claim 1, wherein a shortest distance between adjacent conductive particles is from 0.5 times to 10 times the conductive particle diameter.

14. A method for producing the conductive particle-disposed film comprising:
   disposing conductive particles in a plurality of concave portions in a transfer mold in which the concave portions are formed in a planar direction;
   pressing an elastomer film against a surface of the transfer mold in which the concave portions are formed so as to transfer the conductive particles to the elastomer film;
   interposing the elastomer film having the transferred conductive particles between a pair of platens;
   subjecting the elastomer film to application of heat and pressure so as to push the conductive particles into the elastomer film and form the thermoset elastomer film, wherein
      a thickness t of the thermoset elastomer film approximately coincides with an average particle diameter d of the conductive particles in such a manner that opposite ends of the conductive particles are exposed at respective outermost faces of both surfaces of the thermoset elastomer film,
      one end of the conductive particles is exposed at the outermost face of the surface such that an exposed height falls within 30% of the thickness t of the thermoset elastomer film in the thermoset elastomer film, and
      95% or more of all of the conductive particles in a rectangular or square area having 2000 or more of the conductive particles are regularly, independently disposed in a planar view of the thermoset elastomer film, and
   forming the conductive particle-disposed film by layering a plurality of the thermoset elastomer films together, wherein the conductive particle-disposed film is attachable to and detachable from an electronic circuit substrate.

* * * * *